United States Patent [19]

Nestor

[11] Patent Number: 5,116,456
[45] Date of Patent: May 26, 1992

[54] APPARATUS AND METHOD FOR GROWTH OF LARGE SINGLE CRYSTALS IN PLATE/SLAB FORM

[75] Inventor: Ontario H. Nestor, Shaker Heights, Ohio

[73] Assignee: Solon Technologies, Inc., Solon, Ohio

[21] Appl. No.: 182,995

[22] Filed: Apr. 18, 1988

[51] Int. Cl.$^5$ ............................................. C30B 11/02
[52] U.S. Cl. .............................. 156/616.1; 156/616.2; 156/616.3; 156/616.4; 156/616.41; 156/DIG. 83; 156/DIG. 88; 164/122.1; 164/122.2
[58] Field of Search ............... 156/616.1, 616.2, 616.3, 156/616.4, 616.41, DIG. 83, DIG. 88; 422/248; 164/122.1, 122.2

[56] References Cited

U.S. PATENT DOCUMENTS

| | | | |
|---|---|---|---|
| 2,640,861 | 6/1953 | Kremers | 156/616.41 |
| 3,139,653 | 7/1964 | Orem | 164/122.2 |
| 3,538,981 | 11/1970 | Phipps | 164/122.1 |
| 3,770,047 | 11/1973 | Kirkpatrick et al. | 164/122.1 |
| 3,897,815 | 8/1975 | Smashey | 164/122.1 |
| 3,898,051 | 8/1975 | Schmid | 156/617.1 |
| 4,038,201 | 7/1977 | Hargreaves | 156/617.1 |
| 4,083,748 | 4/1978 | Gault | 156/616.2 |
| 4,096,025 | 6/1978 | Caslavsky et al. | 156/616.1 |
| 4,110,080 | 8/1978 | Pastor | 156/616.1 |
| 4,251,315 | 2/1981 | Pastor | 156/617.1 |
| 4,289,570 | 9/1981 | Terkelsen | 164/122.1 |
| 4,382,838 | 5/1983 | Authier | 156/616.4 |
| 4,510,609 | 4/1985 | Caslavsky et al. | 373/110 |
| 4,521,272 | 6/1985 | Gault | 156/616.1 |
| 4,533,822 | 8/1985 | Fujii et al. | 219/553 |
| 4,703,556 | 11/1987 | Wilsey | 29/611 |
| 4,767,493 | 8/1988 | Mino | 164/122.1 |

FOREIGN PATENT DOCUMENTS

| | | | |
|---|---|---|---|
| 186249 | 7/1986 | European Pat. Off. | 156/616.1 |
| 218087 | 4/1987 | European Pat. Off. | 156/616.1 |
| 3532131 | 3/1987 | Fed. Rep. of Germany | 164/122.1 |
| 3532142 | 3/1987 | Fed. Rep. of Germany | 164/122.1 |
| 60-141695 | 7/1985 | Japan | 156/616.4 |
| 1173690 | 12/1969 | United Kingdom | 156/616.1 |

OTHER PUBLICATIONS

Crszek et al., "Solar-Grade Silicon by Directional Solidification in Carbon Crucibles", IBM, J. Res. Develop, vol. 23, No. 3, May 1979, 270–277.
Reed et al., "Growth of Ni-Doped MgF2 Crystals in Self Sealing Graphite Crucibles", Journal of Crystal Growth, 42(1977), Dec., pp. 569–573.
Atherton Abstract, "Modelling Bridgman Growth of YAG:Nd in Ampoules of Rectangular Cross-Section," Abstracts of The Seventh American Conference on Crystal Growth, pp. 7 and 8, Jul. 12–17, 1987.
Cooper et al., Abstract, "Growth of YAG:Nd in Metal Ampoules by a Modified Bridgman Technique," Abstracts of the Seventh American Conference on Crystal Growth, pp. 437 and 438, Jul. 12, 1987.

*Primary Examiner*—Robert Kunemund
*Attorney, Agent, or Firm*—Renner, Otto, Boisselle & Sklar

[57] ABSTRACT

Apparatus and method for controlled growth of large single crystals in plate/slab form from a melt, characterized by a crucible having a narrow thickness dimension that is small enough to permit adequate control over the growth interface across the full width of the crucible and a scalable larger width dimension permitting the growth of crystals having a width many times the thickness of the grown crystal. The apparatus and method are further characterized by side heating members located in close proximity to the wider side walls and the hence the melt across the width of the crucible for obtaining and maintaining control over the growth interface. The apparatus and method are scalable for the growth of large single crystals such as 1 meter by 1 meter square crystals which heretofore were not obtainable by known apparatus and melt growth methods at least in the case of single crystals such as calcium fluoride.

16 Claims, 9 Drawing Sheets

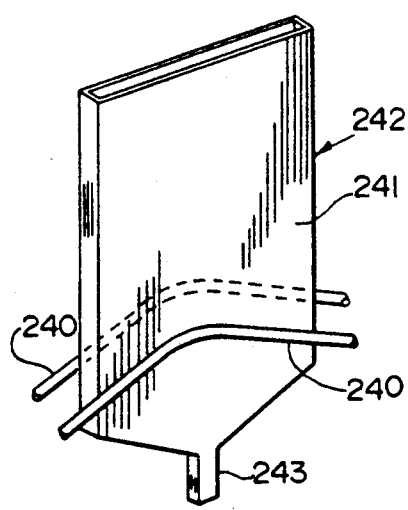
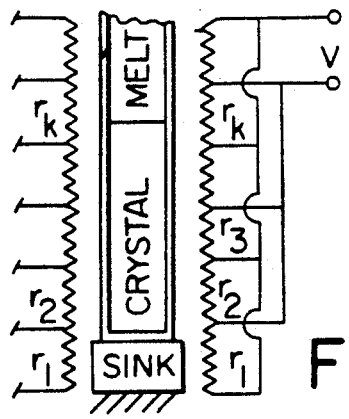
FIG. 19
FIG. 20D
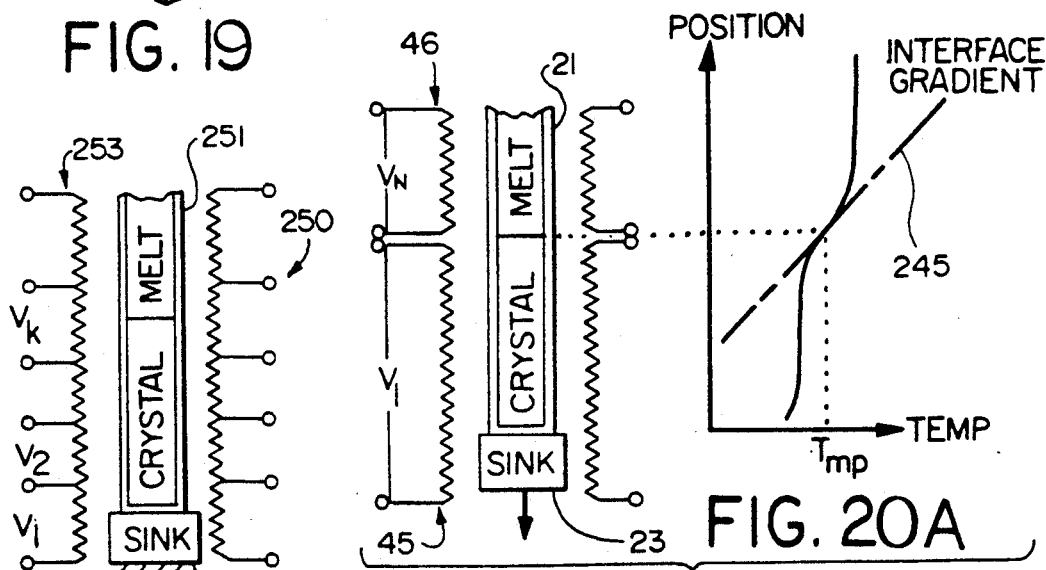
FIG. 20C
FIG. 20A
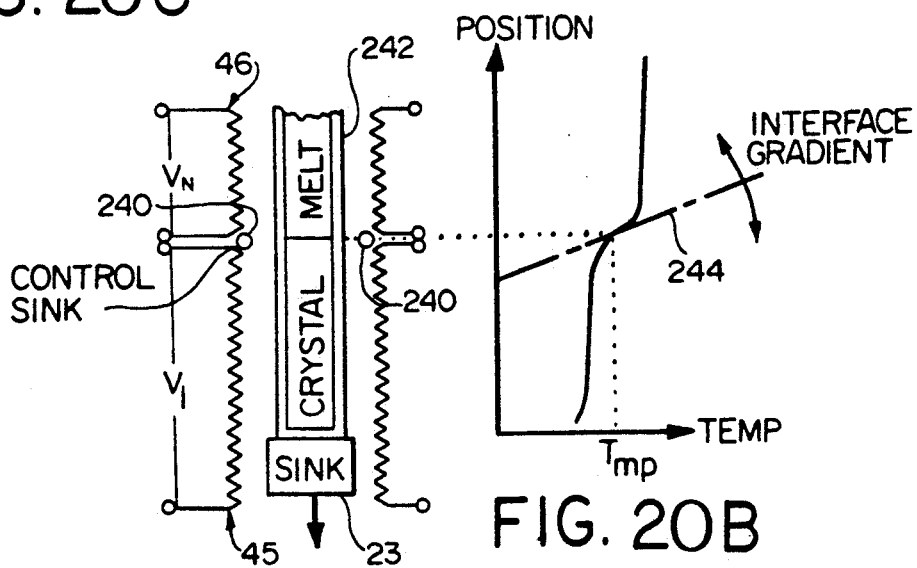
FIG. 20B

APPARATUS AND METHOD FOR GROWTH OF LARGE SINGLE CRYSTALS IN PLATE/SLAB FORM

The invention herein described relates generally to an apparatus and method for growing crystals and, in particular, single crystals of large size in plate/slab form with minimal structural imperfections.

BACKGROUND OF THE INVENTION

An increasing demand exists in several industries for large single crystals of various substances having high melting temperatures. To be useful these crystals must often be essentially free of structural defects such as large angle grain boundaries, inclusions, etc. Such industries include the electronics industry which wants large single crystals for economical mass production of semiconductor devices. Large single crystals also are in demand for use in lasers which employ, for example, crystalline laser rods or crystalline plates to close the emission end of gas lasers.

A widely used technique to grow single crystals is the Czochralski method. This method involves the melting of crystal growth stock in a crucible located in a furnace. A seed crystal having a predetermined orientation is dipped into the melt, and the heat input provided by the furnace to the melt is reduced while the seed crystal is rotated and slowly withdrawn from the melt.

Another widely used technique for growing single crystals is the Bridgman-Stockbarger process. Instead of withdrawing a seed crystal from a melt, a seed crystal is positioned at the base of the crucible into which melt stock is loaded. The crucible is heated to form a melt that varies in temperature from the seed temperature to higher temperatures upward into the melt. The crucible is then lowered slowly from a high temperature melt zone to a lower temperature cooling zone to induce crystal growth from the seed crystal at the base of the crucible to the top of the melt.

Still another technique generally referred to as vertical gradient freeze process maintains the crucible stationary while otherwise inducing vertical crystal growth in the crucible. For example, overall heating power may be lowered so as to move the melting point isotherm upward through the crucible. Another procedure involves use of a heat exchanger to extract heat from the base of the crucible. In general, it is desirable in the vertical gradient freeze process and also in the Bridgman-Stockbarger process to partially melt back the seed crystal to mitigate against a polycrystalline growth start.

Most if not all apparatus and methods currently being used commercially to grow single crystals produce crystal ingots having a cylindrical shape. If crystals in plate or slab form, or some other non-cylindrical form, are required for a particular application, these shapes would be cut from the raw cylindrical crystals. An attempt has been made to grow a single crystal of sapphire in plate/slab form using a rectangular crucible. This attempt involved a Czochralski type process wherein the seed is dipped into and then slowly pulled from the melt heated to a molten state by an RF heater. The Czochralski method, however, is believed to be incompatible with the growth of large crystals having a large dimension normal to the growth direction because of gravity induced defects resulting from the inability to provide bottom support for the weight of the crystal during growth.

Respecting known methods and furnaces presently being used commercially to grow single crystals of cylindrical shape, attempts to grow larger crystals give rise to problems of one sort or another such as that noted above with respect to the Czochralski method. One or more of these problems in significant part arise from the difficulty in maintaining an adequate (sufficiently high and axially directed) temperature gradient over the full cross-section of the increased diameter growth crucible. As the diameter of the crystal is increased, there comes a point where control of the growth process at the liquid-solid interface is no longer adequate. For single component crystals, in general, acceptable yields have been obtained for crystal diameters up to about 4 inches in diameter. However, as diameter is increased, the yields of single crystals progressively decrease; e.g., one might obtain just one 12 inch diameter crystal of acceptable quality out of a hundred growths.

In general, these known methods and furnaces for growing single crystals are generally not scalable. A scaled-up version of the furnace is unlikely to operate with performance equivalent to that of the smaller version. One reason for this is that as the diameter of the crystal is increased, the spacing between the center of the crystal and the controlled source of heat also is increased. As a result it becomes more difficult to control the temperature gradient at the center of the crystal-melt interface. Consequently, there is reduced control over the crystal growth process and increased likelihood of polycrystalline growth.

SUMMARY OF THE INVENTION

The present invention provides for controlled growth of large single crystals in plate/slab form from a melt. The apparatus and method of the invention are characterized by a crucible having a narrow thickness dimension that is small enough to permit adequate control over the growth interface across the full width of the crucible and a scalable larger width dimension permitting the growth of crystals having a width many times the thickness of the grown crystal. The apparatus and method are further characterized by side heating members located in close proximity to the wider side walls, and hence to the melt across the crucible wall, for obtaining and maintaining control over the growth interface. Also provided as preferred if not necessary components are end heating members in close proximity to the narrow ends of the crucible. Preferably the side heater members are located about the same distance from the center line of the liquid-solid interface which center line is normal to the narrow thickness dimension. The apparatus and method are scalable for the growth of large single crystals such as 1 meter by 1 meter square crystals.

More particularly, the invention provides a furnace for growing a crystal in plate/slab form from a melt comprising a crucible for containing the melt, the crucible including a bottom wall, two wide side walls and two narrow end walls; and a heating assembly for heating the melt and establishing therein a vertical temperature gradient to induce growth of a crystal within the crucible, the heating assembly including side heating members spaced apart to closely accommodate the crucible therebetween with the wide side walls of the crucible located in close proximity to the side heating members. The heating assembly preferably also includes parallel end heating members spaced apart to closely accommodate the crucible therebetween with the narrow end walls located in close proximity to the end heating members.

The heating assembly may include one or more heaters each including side and end wall heating members closely surrounding the crucible. Preferably the walls of the crucible are as thin as possible while still having sufficient strength for containment of the melt and also handling as during assembly and disassembly in the furnace. The heating members also preferably are located as close as possible to the walls of the crucible for obtaining precise control over the temperature of the melt.

In a preferred form of furnace, the heating apparatus includes upper and lower heaters each including side and end heating members including resistance heating elements to which electrical power is supplied. The side heating elements are planar and parallel to respective ones of the wide side walls of the crucible and the end heating elements are planar and parallel to respective ones of the end walls of the crucible. Accordingly, the side heating elements and end heating elements together may form a box shape heater surrounding the crucible. The upper and lower heaters of rectangular box shape define upper and lower heat zones, respectively. Provision also is made for vertically lowering the crucible from the upper zone to the lower zone. Alternatively the crucible is held stationary with an upper portion of the crucible located in the upper heat zone and a lower portion of the crucible located in the lower heat zone while heat inputted by the upper and lower heaters to the melt in the crucible is controlled for establishing a vertical temperature gradient in the melt to induce crystal growth from the bottom of the crucible to the top of the crucible.

The heaters are supported and supplied with electrical power by upright electrode posts and horizontal connectors mounting and electrically connecting the upper and lower heaters to respective ones of the electrode posts. The connectors include horizontal arms radiating from said heaters for mounting to said electrode posts. An insulation envelope, which may be of several sections, surrounds the upper and lower heaters. Also provided is a top heater located at the upper end of the upper heater. The heater assembly and crucible are located in an environmental chamber for growth of the single crystal in a controlled environment such as a vacuum.

According to another aspect of the invention, a furnace for growing a crystal in plate/slab form from a melt comprises a crucible for containing the melt, the crucible having a long dimension and a short dimension in horizontal cross-section, and the crucible including a bottom wall, opposite vertical side walls having inner and outer surfaces extending perpendicular to the short dimension, and opposite vertical end walls having inner and outer surfaces extending perpendicular to the long dimension; and a heating assembly for heating the crucible, the heating assembly including upper and lower heaters, the heaters each including planar heating members located proximate and parallel to the vertical walls of the crucible. The narrow dimension of the crucible is within a range permitting adequate control of the growth process at the melt-crystal interface, and the wide dimension is greater than said range. Provision is made for effecting motion of the growth interface up through the crucible.

Further in accordance with the invention, a method for growing a large single crystal in plate/slab form from a melt comprises the steps of melting crystal growth stock in a crucible having a wide dimension and a narrow dimension, the narrow dimension being within a range permitting adequate control of the growth process at the melt-crystal interface, and the wide dimension being greater than said range; and controlling heat inputted into the melt to establish a vertical temperature gradient in the melt for crystal growth progressively vertically upward through the crucible. The step of controlling heat includes using resistance heaters in close proximity to at least the wide dimension sides of the crucible to input heat into the melt.

According to another aspect of the invention, a furnace and method for growing a crystal in plate/slab form from a melt is characterized by a crucible for containing the melt, a heater for heating the crucible and establishing a thermal gradient for growth of a crystal from the melt, and linear cooling elements extending transversely with respect to the growth direction of the crystal and close to the crucible for increasing the temperature gradient locally at the melt-crystal interface. Provision also is made for effecting relative movement between the crucible and linear cooling elements during crystal growth.

The foregoing and other features of the invention are hereinafter fully described and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

FIG. 19 is a schematic isometric view illustrating another technique according to the invention;

FIG. 20A is a schematic illustration of one crystal growing technique shown in association with a graph showing the temperature of the melt/crystal along the vertical axis of the crucible;

FIG. 20B is schematic illustration of a crystal growing technique according to the invention shown in association with a graph showing the temperature of the melt/crystal along the vertical axis of the crucible; and FIGS. 20C and 20D are schematic illustrations of other crystal growing techniques useful in carrying out the invention.

DETAILED DESCRIPTION

The preferred embodiment and best mode for carrying out the subject invention will be described mainly in terms of growing calcium fluoride ($CaF_2$). However, such description is merely exemplary and it will be appreciated by those skilled in the art that the inventive concept described is equally applicable to the growth of other compounds including, for example, various other alkaline earth halides, alkali metal halides, rare earth halides, oxides, semiconductors; in short, to growth of any congruent melting compound whose solid density exceeds or equals its liquid density. Additionally, the terms "parallel", "perpendicular", "vertical", "horizontal", and the like are not intended to mean exactly parallel, exactly perpendicular, and so on unless expressly indicated. Rather, these terms are intended to encompass a range of variation as would normally be understood by one having ordinary skill in the art.

I. General Description

Figure 1:
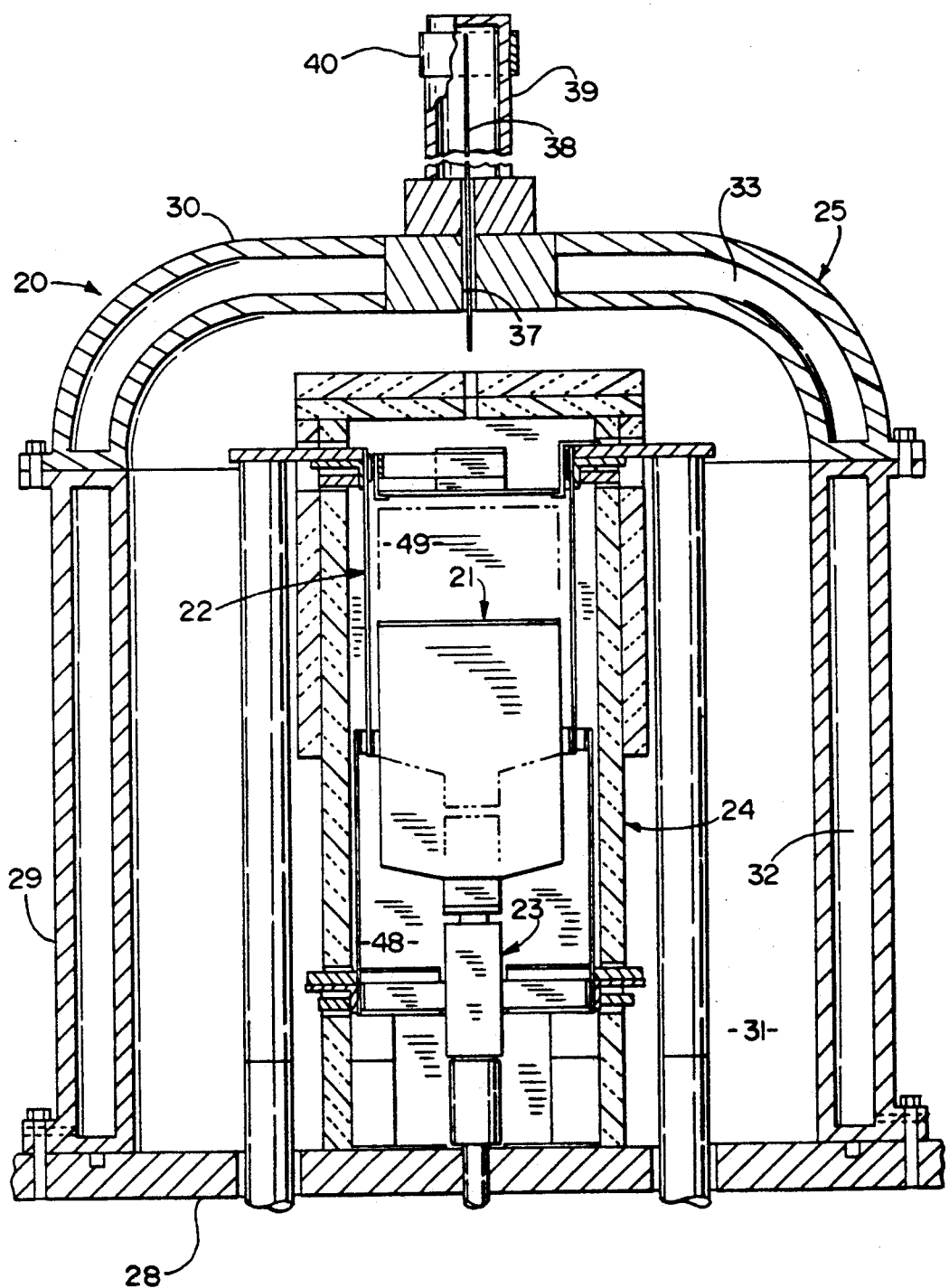
FIG. 1 is a somewhat schematic vertical sectional view of an apparatus according to the present invention.

Referring now in detail to the drawings and initially to FIG. 1, an apparatus for growing crystals according to the invention is indicated generally at 20. The apparatus 20, herein referred to as a crystal growing furnace, generally comprises a crucible 21, a crucible heater assembly 22, crucible support/elevator assembly 23, insulation envelope 24 and an environmental chamber 25. The crucible 21, crucible heater assembly 22 and insulation envelope 24 are housed within the environmental chamber 25 which provides a controlled environment in which the crystals are grown. The particular environment to be maintained depends on the material of the crystal. For growing calcium fluoride, for example, it is desired to maintain a vacuum within the environmental chamber 25. It also is contemplated that the environmental chamber may not be necessary for those materials that can be grown in the presence of air at atmospheric pressure.

In the illustrated embodiment the environmental chamber 25 is a vacuum chamber comprising a base plate 28, cylindrical wall 29 and dome 30 which are secured together in known manner to form a gas-tight interior space 31. For high temperature operation as is needed to grow calcium fluoride crystals, the wall 29 and dome 30 preferably are water cooled by passage of cooling water through internal water channels 32 and 33, respectively. Although not shown, suitable means are provided for evacuating the vacuum chamber as is desired when growing single crystals of calcium fluoride.

At the center of the dome 30 there is provided an opening 37 through which a probe rod 38 passes into the interior space 31. The probe rod 38 also extends above the dome and into a sight glass 39 where the position of the rod can be visually observed. The sight glass is suitably sealed with respect to the dome to preserve a vacuum maintained in the vacuum chamber.

The probe rod 38 is movable axially along the center axis of the vacuum chamber 25 by a positioning device 40 slidably mounted on the outside of the sight glass 39. The positioning device 40 is magnetically coupled to the upper end of the probe rod so that vertical movement of the positioning device results in like vertical movement of the probe rod. Magnetic coupling between the positioning device and probe rod may be obtained in any suitable manner. The purpose of the probe rod is discussed hereinafter in connection with the method of operation of the crystal growing furnace 20.

II. Crucible Heater Assembly

Figure 2:
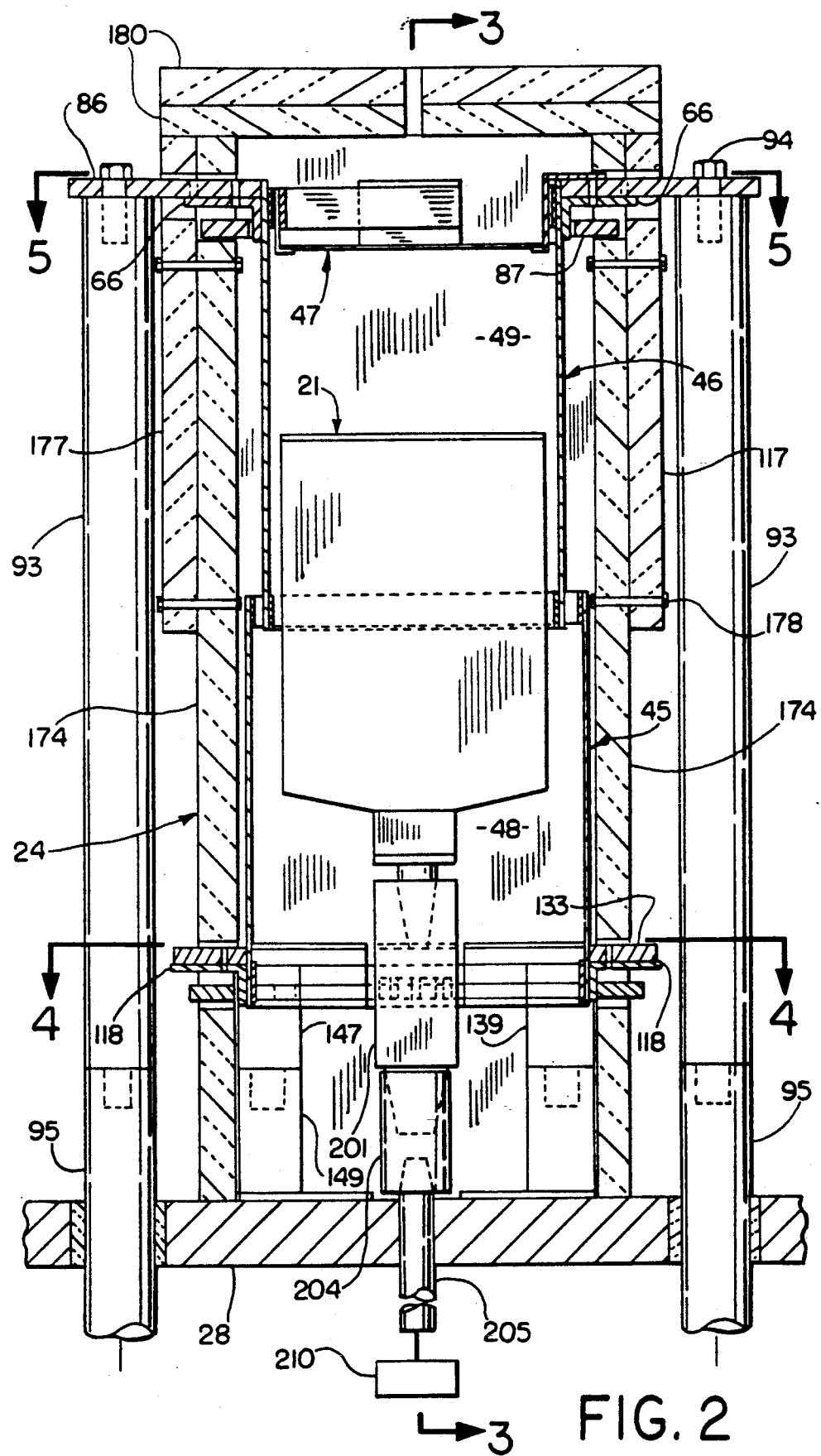
FIG. 2 is an enlargement of the central portion of FIG. 1.
Figure 3:
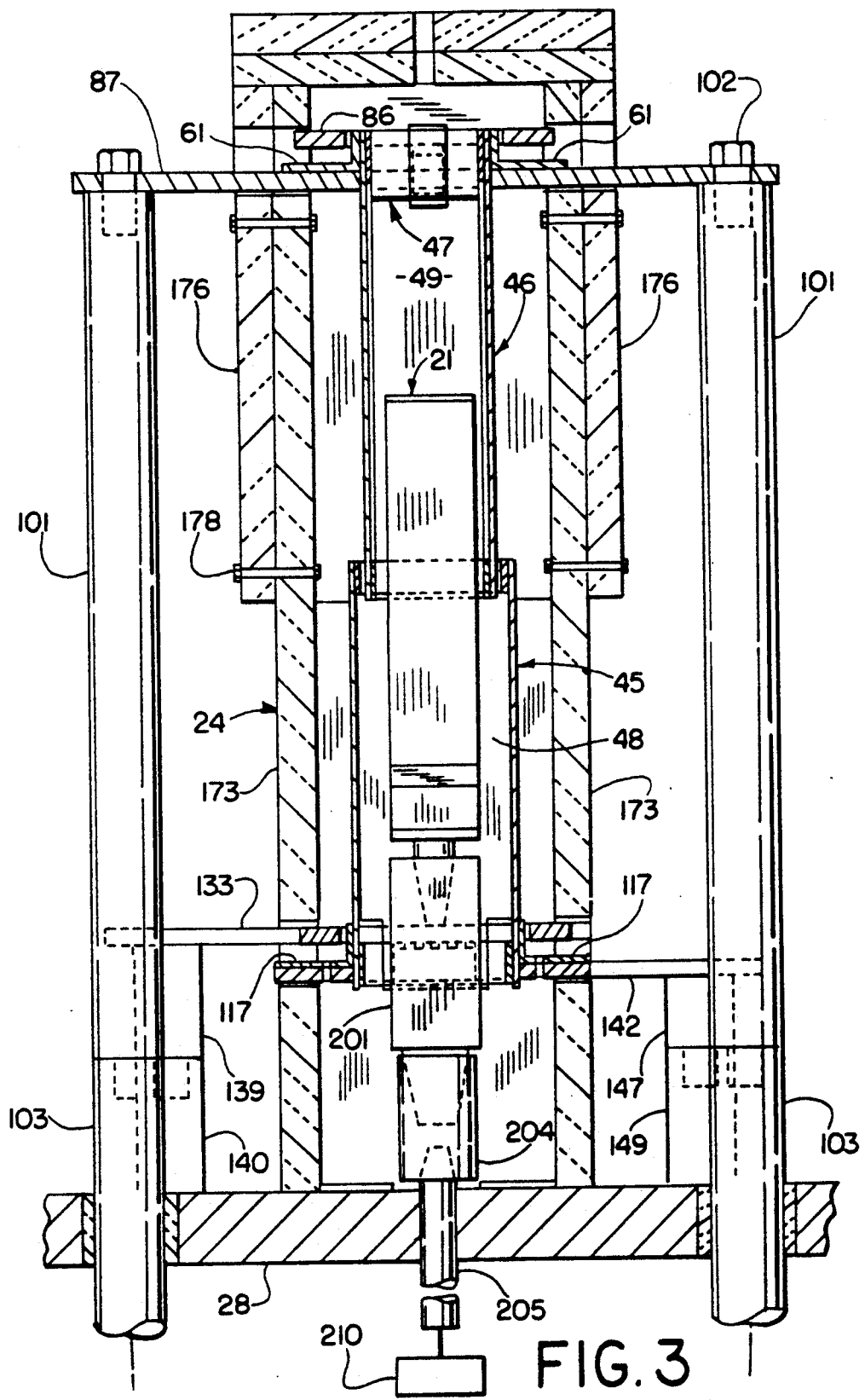
FIG. 3 is a vertical sectional view of the apparatus taken substantially along the line 3—3 of FIG. 2.

Referring now to FIGS. 2 and 3, the crucible heater assembly 22 comprises a lower heater 45, upper heater 46 and top heater 47. The lower and upper heaters respectively form lower and upper heat zones 48 and 49, respectively. As seen in FIGS. 2 and 3, the lower end of the upper heater 46 extends into and overlaps the upper end of the lower heater 45. Consequently, the upper heater is of smaller transverse (horizontal) dimension than the lower heater as is desired for positioning of the sides of the upper heater more closely adjacent or proximate the sides of the crucible 21. As discussed further below, during operation of the furnace the upper heat zone 49 for the most part is maintained at a higher temperature than the lower heat zone 48. It is in the upper heat zone that the melt stock is melted and maintained in a molten state while the lower heat zone is maintained at a lower temperature below the melting point of the crystal material. Accordingly, the lower heat zone may be referred to as a cooling zone and the upper heat zone may be referred to as a melt zone.

A. Upper Heater

Figure 9:
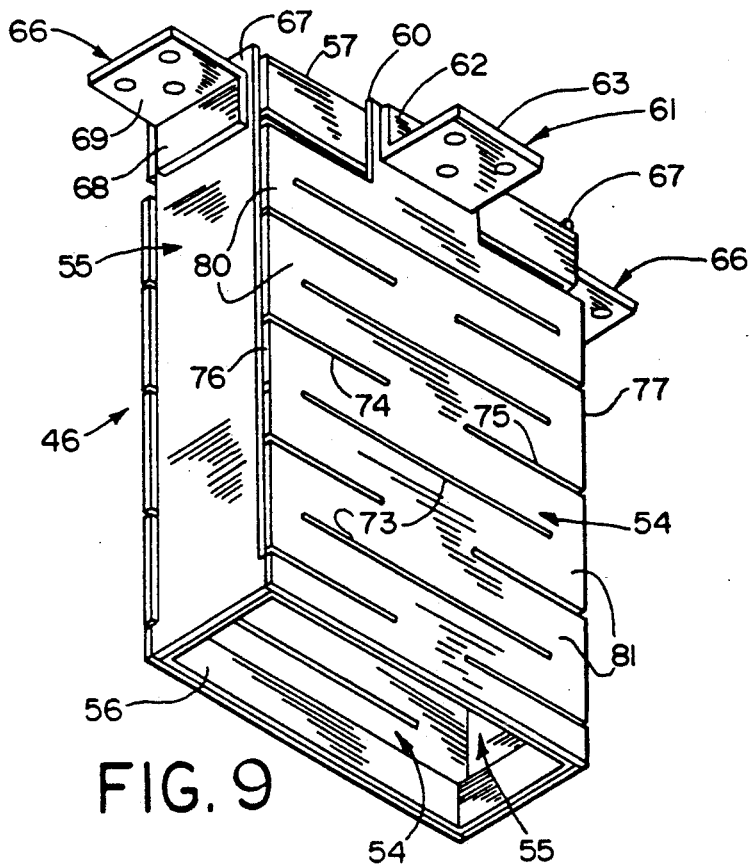
FIG. 9 is an isometric view of an upper heater assembly employed in the apparatus.

Turning now to FIG. 9, the upper heater 46 can be seen in isometric view to comprise side heating members in the form of panels 54, end heating members in the form of panels 55, lower mounting bracket 56, and upper mounting bracket 57. The side panels 54 and end panels 55 each are generally planar, flat and rectangular in shape. The side and end panels are assembled together to form respective wide sides and narrow ends of the upper heater which can be seen to have a box shape with an open top and bottom. Accordingly, the upper heater may be referred to as a rectangular box heater having a thickness dimension substantially less than its width dimension as can be seen in FIG. 9.

In the illustrated embodiment the side panels 54, end panels 55, lower mounting bracket 56 and upper mounting bracket 57 are all fabricated from graphite for use in generating the temperatures needed in the melt zone to melt calcium fluoride which has a melting point of 1350° Centigrade. An isotropic graphite is preferred so that the heating rate per unit area does not vary with grain direction. The graphite, for example, may be 2020 graphite available from Weaver Industries.

The side panels 54 and end panels 55 are secured at their lower ends to respective sides of the lower mounting bracket 56. The lower mounting bracket can be seen in FIG. 9 to have a rectangular ring-shape and such bracket is herein also referred to as a mounting ring. The panels may be secured to the sides of the mounting ring 56 by suitable means such as with graphite cement. Graphite dowel pins or other suitable fasteners also may be used as desired.

During assembly of the upper heater 46, the upper ends of the side panels 54 and end panels 55 are similarly secured to respective sides of the upper mounting bracket 57 in order to facilitate handling of the upper heater and its assembly in the furnace. The upper mounting bracket or ring is similar to the lower mounting ring 56, but after assembly of the upper heater in the furnace those portions of the upper mounting ring 57 extending between the upper ends of adjacent panels are removed. This is done to isolate electrically the upper end portions of the panels to provide for proper current flow through the upper heater in the manner hereinafter described.

As seen in FIG. 9, each side panel 54 has a centrally located mounting tab 60 at its upper end. Secured to the mounting tab 60 is an L-shaped side panel mounting bracket 61. The mounting bracket 61 has a shorter vertical leg 62 secured to the outer side of the mounting tab 60 and a longer horizontal leg or mounting arm 63 extending at right angles to the plane of side panel 54. The bracket 61 may be secured by any suitable means to the mounting tab 60 such as by graphite cement and/or graphite dowel pins.

In similar manner end panel mounting brackets 66 are secured to upper mounting tabs 67 of the end panels 55. Each L-shaped end panel mounting bracket 66 has a shorter vertical leg 68 secured to the outer side of the end panel mounting tab 67 and a longer horizontal leg or mounting arm 69 extending outwardly at right angles to the plane of the end panel 55. The horizontal mounting arms 69 of the end panel mounting brackets 66 are coplanar as are the mounting arms 63 of the side panel mounting brackets 61. The respective horizontal planes of the end panel mounting arms 69 and side panel mounting arms 63 are parallel but vertically offset with respect to one another as is desired for attachment to panel connectors in the hereinafter described manner.

As seen in FIG. 9, each side panel 54 has horizontal slots formed therein in a symmetrical pattern. A first series of slots 73 extend horizontally from the vertical center line of the side panel in both directions and terminate short of the side panel edges. Also provided are a second series of slots 74 and a third series of slots 75 which extend horizontally inwardly from respective vertical edges 76 and 77 of the side panel 54. Going from top to bottom, the middle slots 73 alternate with the edge slots 74 to form a series of panel segments or pickets 80 in a zigzag formation. Similarly, the middle slots 73 alternate with the other edge slots 75 to form another series of panel segments or pickets 81 arranged in a zigzag formation or "ribbon".

As discussed below, the heater ribbons, i.e., the zigzag formations of panel segments 80 and 81, form respective serpentine current paths running from the mounting tab 60 to the lower panel segments which are secured to the lower mounting ring 56. The horizontally aligned panel segments 80 and 81 are preferably integral in the region extending between adjacent middle slots 73 for improved strength, but such segments could be divided by a vertical slot extending between the adjacent horizontal middle slots 73. As is also preferred, the middle slots 73 are uniformly vertically spaced apart with respect to the slots 74 and 75 to provide panel segments of uniform width.

If the upper heater panels are made from a graphite which has a grain, the grain of the graphite side panels 54 preferably is oriented vertically such that the grain extends at right angles to the current path over a major portion of such current path. As for the graphite end panels 55 and mounting rings 56 and 57, the grain preferably is oriented horizontally. Of course the grain of the graphite material may be oriented as desired to promote heat generation where desired or reduce resistance to current flow at other locations. However, as above indicated, preferably isotropic graphite is used so that heating rate per unit area does not vary with grain direction. The heating rate per unit area facing the crucible is given by $$q = I^2 \rho / w^2 t$$

where "I" equals current through the heater, "$\rho$" equals resistivity of the heater element material, "w" equals width of the heater element ribbon, "t" equals the thickness of the heater element.

The thickness of the side panels and other heater components, the size of the slots in the panels, the spacing of the slots, i.e., the width of the current path, etc. may be selected as needed for a given application depending, for example, on the temperature required, current requirements, space considerations, etc. It also is noted that the vertical spacing of the slots need not be uniform. For example, the spacing and consequently the width parameter "w" may be reduced at the mounting (upper) end of the upper heater to help overcome some of the end loss there. Although less desirable in the illustrated heater, the slots in the side panels may run vertically instead of horizontally with appropriate modification of associated components. In fact, the heater panels may be unslotted as illustrated by the end panels 55; the width and thickness coupled with the graphite type of the panels may yield a suitable heating rate without resort to slotting.

As discussed in greater detail below, the zigzag formations of panel segments 80 and 81 form parts of respective circuits connected in parallel between the side panel mounting bracket 61 on the one hand and respective ones on the end panel mounting brackets 66 on the other hand. Likewise, the other side panel will form respective parts of a pair of circuits connected in parallel between the side panel mounting bracket 61 and respective ones of the end panel mounting brackets 66. These circuit paths are completed by the end panels 55 which are electrically connected at their lower ends to the lowermost segments of the side panels by the lower graphite mounting ring 56. The vertical edges of the end panels 55 are spaced from the adjacent side panels to prevent electrical connection therebetween except at the lower end of the upper heater 46. The end panel 55 however may have at its lower end a width permitting direct contact with the lower most side panel segments as seen in FIG. 9.

In the manner hereinafter described, the side mounting brackets 61 are connected to a first terminal of a current (power) source and the end panel mounting brackets 66 are connected to a second terminal of a current source. When thusly connected the upper heater may be viewed as comprising four resistance heating circuits connected in parallel to the current source. Each circuit includes a respective side of a side panel 54 and a respective half portion of an adjacent end panel 55. However, in the illustrated embodiment, the individual circuits have common nodes along their respective paths with one or more of the other circuits. For example, the lower mounting ring 56 serves as a common node for all four circuits. This visualization of the heater assembly as comprising four identical parallel circuits facilitates selection of design criteria for any given application such as current requirements, side panel and end panel thicknesses, vertical spacing between the slots in the side panels, etc.

Figure 7:
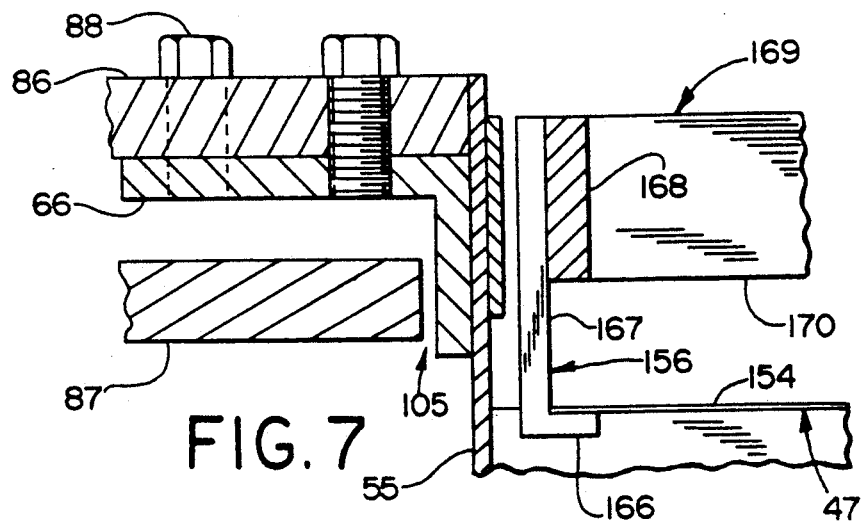
FIG. 7 is an enlarged partial sectional view of the apparatus taken substantially along the line 7—7 of FIG. 6.

Referring back to FIGS. 2 and 3, the end panel mounting brackets 66 can be seen to be mounted to the underside of an end panel connector 86 and the side panel mounting brackets 61 can be seen to be mounted to the top side of a side panel connector 87. The mounting brackets 66 and 61 preferably are removably mounted to the connectors 86 and 87 such as by fasteners 88 seen in FIGS. 7 and 8 to permit assembly and disassembly of the furnace.

Figure 5:
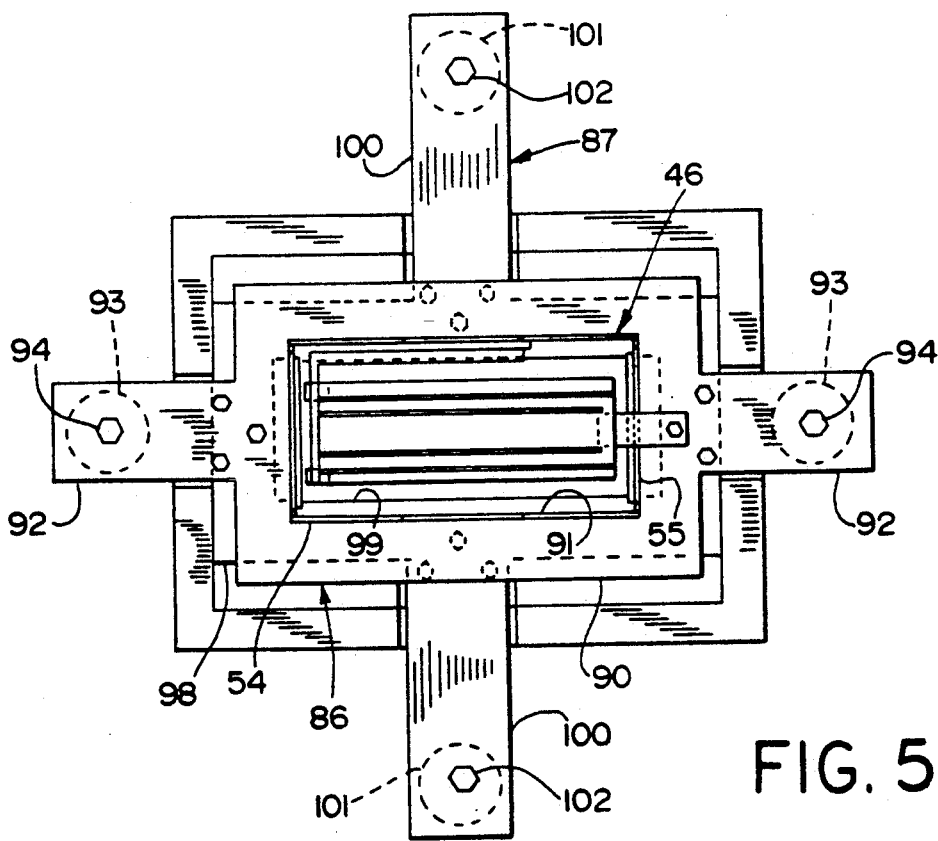
FIG. 5 is another horizontal sectional view of the apparatus taken substantially along the line 5—5 of FIG. 2.

With additional reference to FIG. 5, the end panel connector 86 is a plate having a rectangular central portion 90. The central portion 90 includes a centrally located rectangular opening 91 into which the upper end of the upper heater 46 extends. The shorter end walls of the opening 91 may contact the end panels 55 of the upper heater, but the longer side walls of the opening 91 necessarily are spaced from the side panels 54 of the upper heater to prevent electrical connection therebetween.

The end panel connector 86 also has a pair of oppositely extending arms 92 aligned with the long axis of the rectangular opening 91 or, more particularly, the long axis of the rectangular interior space or heating zone of the upper heater 46. The connector arms 92 extend outwardly for mounting atop the ends of respective upright electrode posts 93. Preferably the connector arms are removably mounted atop the electrode posts 93 by suitable fasteners 94 again to permit disassembly of the furnace.

As seen in FIG. 2, the lower ends of the electrode posts 93 are supported by and coupled as by means of a split ring clamp to power feedthroughs 95 provided in the base plate 28 in conventional manner. The power feedthroughs 95 may be water cooled whereas the electrode posts may be made of graphite such as HLM graphite available from Weaver Industries. The end panel connector 86 and also the side panel connector 87 are preferably made of graphite such as that used to make the side and end panels.

Like the end panel connector 86, the side panel connector 87 is a plate having a central rectangular portion 98 including a centrally located rectangular opening 99 aligned with the opening 91 in the end panel connector 86 as seen in FIG. 5. The longer side walls of the opening 99 may directly contact the side panels 54 of the upper heater 46, but the shorter side walls of the opening 99 necessarily are spaced from the end panels 55 for electrical isolation purposes.

The side panel connector 87 has a pair of oppositely extending arms 100. The arms 100 are aligned with the short axis of the rectangular opening 99 and extend outwardly for mounting atop the ends of upright electrode posts 101. The connector arms 100 preferably are removably mounted to the electrode posts by suitable fasteners 102. At their lower ends, the electrode posts 101 are supported by and electrically coupled, as by means of a split ring clamp, to respective power feedthroughs 103 provided in the base plate 28 as seen in FIG. 3.

As seen in FIGS. 2 and 3, the end panel connector 86 and side panel connector 87 are parallel and supported by the electrode posts 93 and 101 at different elevations. The connectors are vertically spaced apart by a distance sufficient to avoid arcing. It also is noted that suitable gaps are provided between each end panel bracket 66 and side panel connector 87 as can been seen at 105 in FIGS. 7 and 8. Similarly, a gap is provided between each side panel bracket 61 and the end panel connector for electrical isolation purposes.

B. Lower Heater

Figure 10:
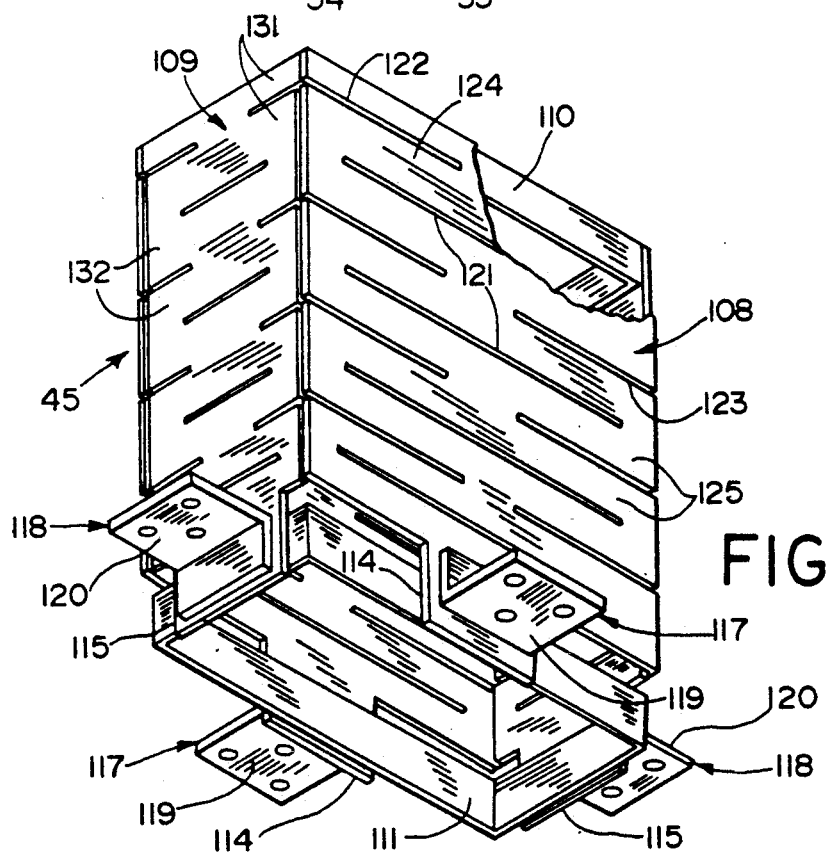
FIG. 10 is an isometric view of a lower heater assembly employed in the apparatus.
Figure 11:
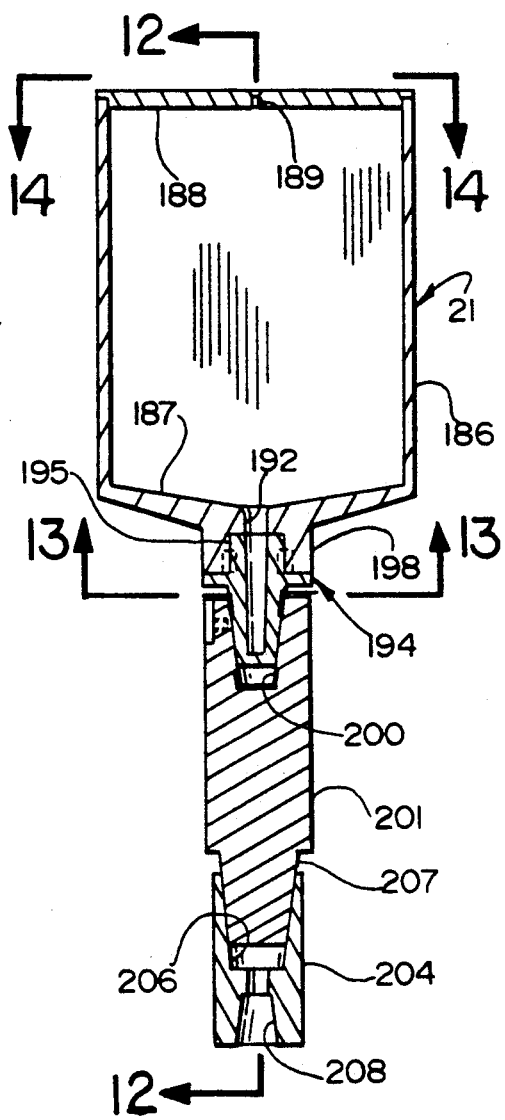
FIG. 11 is a vertical sectional view of a crucible and support/elevator assembly employed in the apparatus.
Figure 12:
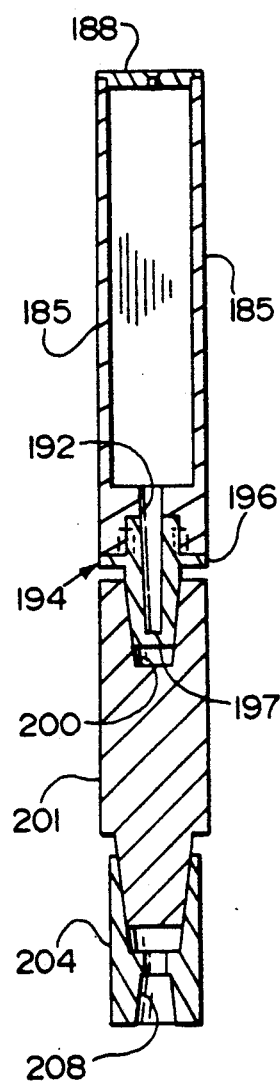
FIG. 12 is a vertical sectional view of the crucible and support/elevator assembly of FIG. 11 taken substantially along the line 12—12 of FIG. 11.
Figure 13:
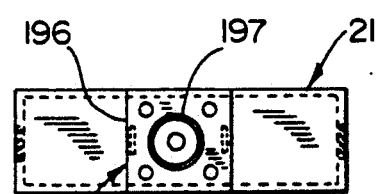
FIG. 13 is a horizontal sectional view taken substantially along the line 13—13 of FIG. 11.
Figure 14:
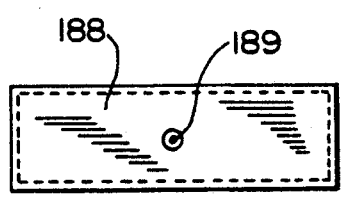
FIG. 14 is a top plan view of the crucible looking from the line 14—14 of FIG. 11.

Referring now to FIG. 10, the lower heater 45 can be seen to have a construction similar although inverted to that of the upper heater 46. Accordingly, the lower heater 45 comprises side panels 108, end panels 109, upper mounting bracket or ring 110 and lower mounting bracket or ring 111. The upper mounting bracket 110 has a rectangular ring-shape and the upper ends of the side and end panels are secured by suitable means to respective sides of the upper mounting ring 110. The lower ends of the panels are similarly secured to the lower mounting bracket 111 to facilitate handling and assembly of the lower heater in the furnace. After assembly and securement of the lower heater to supporting structure in the furnace, the portions of the lower mounting ring extending between the lower ends of adjacent panels are broken away with only fragments being left in the regions of the mounting tabs 114 of side panel 108 and mounting tabs 115 of the end panels 109.

As shown, an L-shaped side panel mounting bracket 117 is secured to mounting tab 114 at the lower end of each side panel 108 and an L-shaped end panel mounting bracket 118 is secured to the lower end or mounting tab portion 115 of each end panel 109. The mounting brackets and the manner of their securement to the heater panels is substantially the same as above described with respect to the upper heater. The horizontal arms 119 of the side panel mounting brackets 117 are coplanar and at an elevation vertically offset from the plane of the mounting arms 120 of end panel brackets 118.

The side panels 108 have a plurality of slots similar to the slots provided in the side panels of the upper heater. More particularly, there is a first series of middle slots 121 and two series of edge slots 122 and 123 which alternate with the middle slots 121. These slots define in the side panel 108 two zigzag formations or ribbons of panel segments 124 and 125 which are located in side-by-side relationship.

Unlike the end panels 55 in the upper heater 46, the end panels 109 of the lower heater 45 also are provided horizontal slots in a pattern corresponding to the pattern of slots in the side panels. Accordingly, there are provided two zigzag formations or ribbons of end panel segments 131 and 132 in side-by-side relationship.

This construction of the lower heater can be viewed as comprising four circuits connected in parallel between the side panel mounting brackets 117 and the end panel mounting brackets 119. Each circuit comprises a respective zigzag formation of side panel segments 124, 125 and the adjacent Zigzag formation of end panel segments 131, 132.

Returning to FIGS. 2 and 3 showing the lower heater 45 assembled in the furnace 20, the end panel brackets 118 are removably mounted by suitable fasteners to the underside of a lower heater end panel connector 133. The connector 133 is in the form of a plate having a generally rectangular middle portion best seen at 134 in FIG. 4. The center portion 134 is rectangular in shape and has a rectangular center opening 135. The opening 135 is rectangular and generally corresponds in size and shape to the outer profile of the lower heater 45 which extends into such opening 135. The shorter side walls of the opening 135 may directly contact the end panels 109 but the longer side walls of the opening necessarily are spaced from the side panels 108 to avoid electrical connection therebetween. The center portion 134 is provided with mounting extensions 136 at the center of its short sides to provide sufficient mounting and electrical connection surface area for attachment of the end panel mounting brackets by the fasteners seen at 138 in FIG. 4.

The connector plate 133 also has a pair of oppositely extending arms 137. The arms 137 extend outwardly along a line angularly offset with respect to either the short or long axis of the rectangular opening 135 (or the rectangular heating zone 48 of the lower heater 45). In the illustrated embodiment the connector arms 137 are angularly offset from the short axis by about 30°. The ends of the connector arms 137 are supported atop and removably mounted by fasteners 141 to the top ends of electrode posts 139. The electrode posts 139 are supported and coupled as by means of a split ring clamp to feedthroughs 140 (FIG. 3) provided in the base plate 28.

Figure 4:
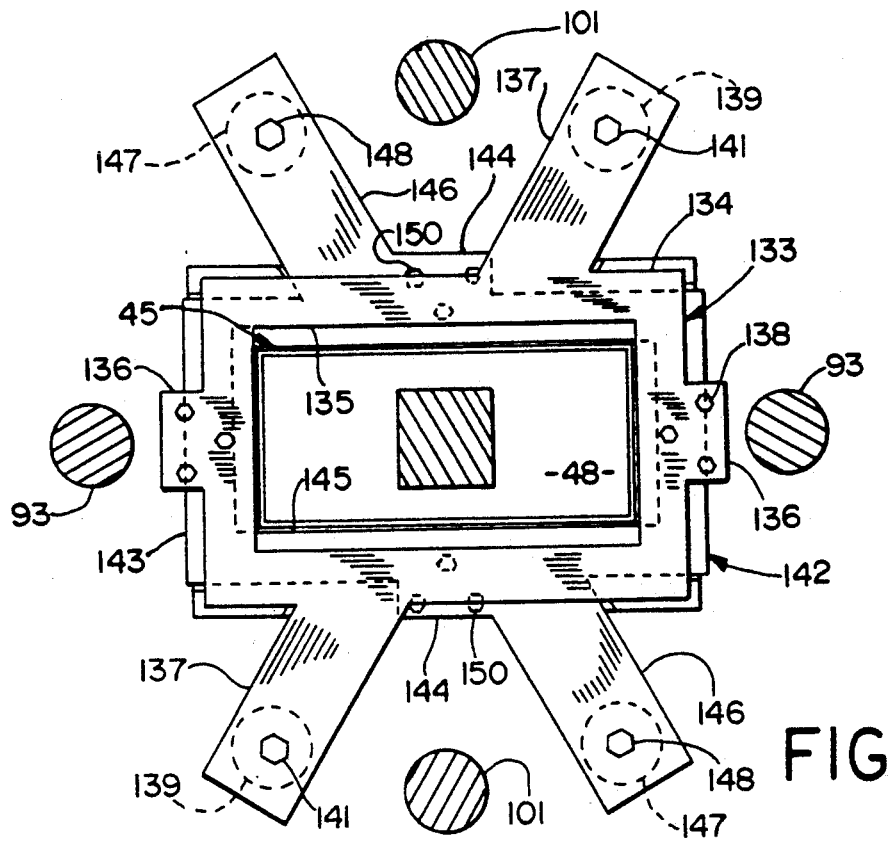
FIG. 4 is a horizontal sectional view of the apparatus taken substantially along the line 4—4 of FIG. 2.

As best seen in FIGS. 3 and 4, the side panel mounting brackets 117 of the lower heater 45 are removably mounted by suitable fasteners atop a lower heater side panel connector 142. The connector 142 is generally in the form of a plate having a rectangular center portion 143 which is best shown in FIG. 4. The center portion 143 is provided with mounting extensions 144 at the center of the long sides thereof to provide sufficient mounting and electrical connection surface area for attachment of the side panel mounting brackets 117 by fasteners 150. The middle portion 143 also has a rectangular opening 145 aligned with the rectangular heating zone 48 of the lower heater 45. The long walls of this opening 145 may directly contact the side panels 108 of the lower heater but the short walls are spaced from the end panels 109 of the lower heater to prevent electrical connection therebetween.

The side panel connector 142 also has a pair of oppositely extending arms 146. The arms 146 are extended in a direction angularly offset from the long and short axes of the rectangular opening 145 and preferably, as shown, in symmetrical relation to the angular offset of the arms 137 of the end panel connector 133. The connector arms 146 are supported atop and removably mounted to electrode posts 147 by suitable fasteners 148. The electrode posts 147 are supported by and coupled as by means of a split ring clamp to feedthroughs 149 (FIG. 3) provided in the base plate 28.

Looking at FIG. 4, the end panel connecting arms 137 and side panel connecting arms 146 can be seen to radiate with respect to the vertical center axis of the furnace and together define an X-shaped formation. Moreover, and looking at FIG. 5, the end panel connector arms 92 and side panel connector arms 100 for the upper heater 46 also radiate with respect to the vertical center axis of the furnace and together form a cross-shaped formation. When the cross-shaped formation (FIG. 5) is superimposed atop the X-shaped formation, the connector arms of the former bisect the angles formed between relatively adjacent arms of the latter formation (FIG. 4). Such an arrangement provides for convenient attachment of the connectors via the arms thereof to the electrode posts 93, 101, 139 and 147 which are circumferences arranged about the vertical center axis of the furnace and, more particularly, the therewith aligned center axis of the lower and upper heaters 45 and 46.

C. Top Heater

Referring now to FIGS. 2, 3 and 5-8, the top heater 47 comprises a rectangular top heating member in the form of panel 154. The top heater panel 154 is supported at one end by a single bracket 155 and at its other end by a pair of laterally spaced apart side brackets 156. The top heater panel 154 has two inner parallel slots 157 extending from one edge of the heater plate and two outer parallel slots 158 extending from the opposite edge of the top heater panel. The slots, which do not extend the entire length of the heater panel, cooperate to form a pair of zigzag formations or ribbons each including two outer panel segments 159 and a shared inner panel segment 160 having approximately twice the width of the outer panel segments.

Figure 8:
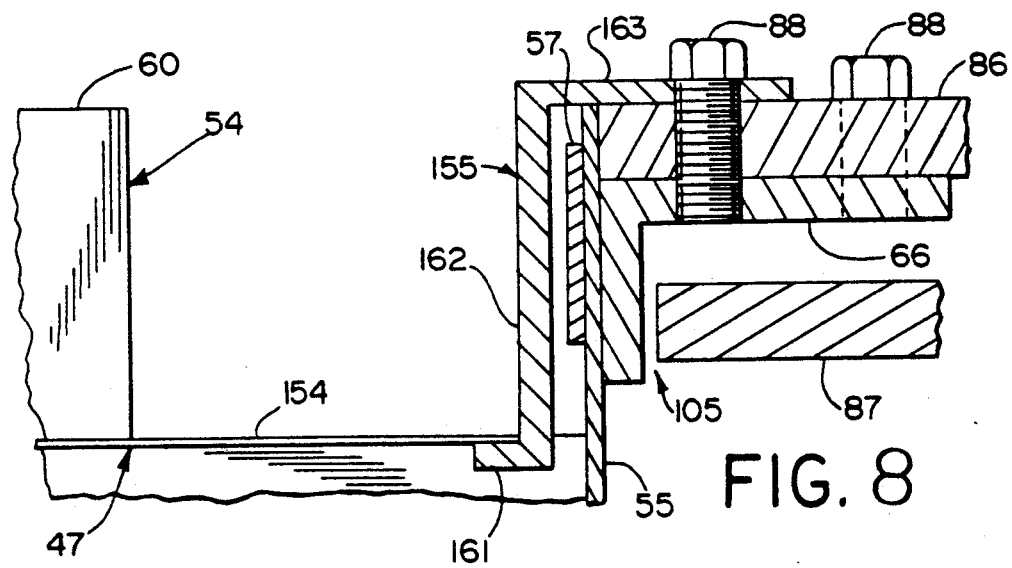
FIG. 8 is an enlarged partial sectional view of the apparatus taken substantially along the line 8—8 of FIG. 6.
Figure 6:
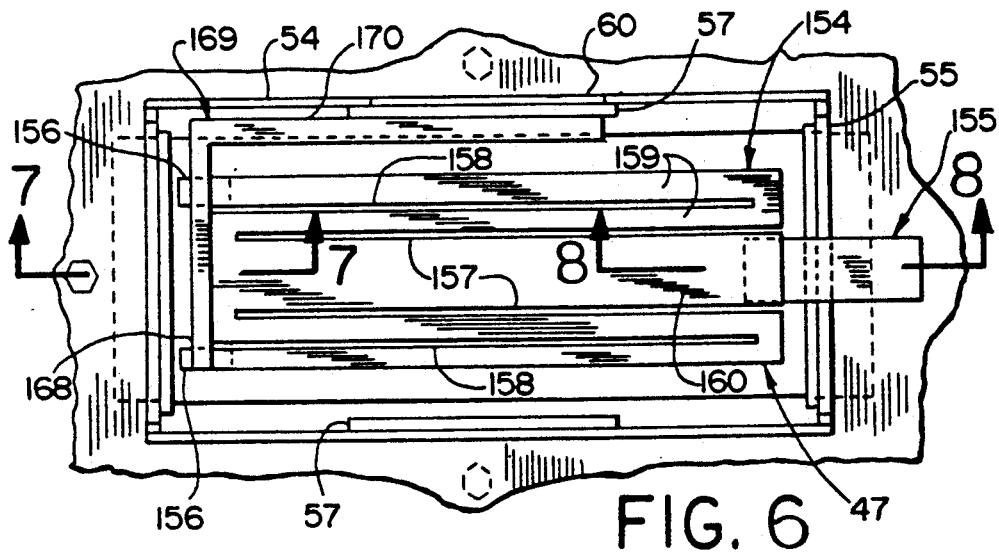
FIG. 6 is an enlargement of the central portion of FIG. 5.

The single bracket 155 at the right end of the top heating panel 154 as seen in FIGS. 6 and 8 has a lower inwardly extending foot 161 secured to the underside of the top heater panel at the free end of the inner panel segment 160. The top heater panel is thusly supported at one end atop this horizontal foot which has a width about equal the width of the inner panel segment 160. The foot extends along the lower edge of a vertical leg portion 162 of the bracket and the bracket further has a mounting arm 163 extending horizontally and outwardly from the top edge of the vertical leg. This horizontal mounting arm 163 is removably mounted atop the upper heater end panel connector 86 by one of the fasteners 88 used to secure the upper heater end panel mounting bracket 66 to the underside of the upper heater end panel connector 86.

At the other end of the top heater panel 154, each mounting bracket 156 has an inwardly extending horizontal foot 166 secured to the underside of the top heater panel at the free end of a respective one of the two outermost panel segments 159. The panel is thusly secured atop the mounting bracket foot 166 located at the lower end of a vertical leg 167. The vertical leg 167 is secured at its upper end to the shorter leg 168 of a horizontal L-shaped connecting bracket 169. The shorter leg 168 of the connecting bracket 169 extends perpendicular to the long axis of the top heater plate. The longer leg 170 of the connecting bracket 169 is located above and at one side of the top heater plate and is secured as by graphite cement to the upper mounting ring fragment 57 secured to the mounting tab 60 of one of the top heater side panels 54.

The top heater mounting brackets 155, 156 and 169, in addition to supporting the top heater panel 154 at the top of the upper heater 46 also provide for electrical connection of the top heater panel between the upper heater end panel and side panel connectors 86 and 87. It further can be seen that the two zigzag formations of the top heater panel segments 159 and 160 provide a pair of circuits connected in parallel between the side and end panel connectors 86 and 87.

In the illustrated embodiment the top heater 47 is thusly fixedly secured to one side panel 54 of the upper heater 46 and removably mounted to the end panel connector 88. If desired, the upper heater may be removably mounted to the side panel mounting tab 60 as well by provision of suitable fasteners accessible, for example, at the inner side of the connecting bracket 169.

In the foregoing manner, the lower heater 45 is mounted at its lower end and extends upwardly. Inversely, the upper heater 46 is suspended at its upper end and extends downwardly to overlap the lower heater generally in the region of the mounting rings as shown in FIGS. 2 and 3. Also, the top heater 47 is mounted at the top of the upper heater and closes off the open top of the upper heater. When the heaters are thusly assembled and mounted, the insulation envelope 24 is assembled around the upper and lower heaters to minimize heat loss from the lower and upper heating zones 48 and 49.

III. Insulation Envelope

With reference to FIGS. 2 and 3, the insulation envelope 24 comprises two side insulation plate 173 and two end insulation plates 174 each extending generally from the top of base plate 28 to a point above the uppermost heater connector 86. The insulation plates 173 and 174 are provided with suitable openings for accommodating the several connectors for the lower and upper heaters 45 and 46. Openings are sufficiently sized to prevent contact between the connectors and other current carrying components since the insulation plates are formed of a fibrous form of graphite which is electrically conductive. Of course, the gaps could be eliminated by selecting another insulation material which is not electrically conductive, but graphite insulation is preferred for fabrication and economic reasons as well as its ability to withstand the temperatures needed to melt calcium fluoride in the case of the herein described embodiment.

The side and end insulation plates 173 and 174 are assembled together atop the base plate 28 to form a box-like formation. The vertical edges of the panels are butted at the corners of the box-like formation and suitable fasteners (not shown) are utilized to removably secure together the panels at their vertical edges.

The upper or melt zone 49 of the furnace preferably is surrounded by thicker insulation. In the illustrated embodiment, there are provided outer side insulation plates 176 and outer end insulation plates 177. These outer side and end plates are secured by fasteners 178 to the outer sides of the inner side and end plates 173 and 174. These outer insulation plates extend from the top of the inner insulation plates to a point proximate the lower end of the upper heater 46.

The insulation envelope 24 also includes a top insulation plate or plates 180 supported atop the side and end insulation plates 173 and 174 and closing the upper end of the box-like shaped formation formed by the side and end insulation plates. At the bottom of the insulation envelope 24 there may be provided additional insulation (not shown) covering the base plate 28 in the region bordered by the side and end insulation plates 173 and 174. This insulation may be loose graphite wool insulation laid atop the base plate 28 to reduce heat loss through the base plate, although some heat loss is desired in connection with the establishment of a vertical temperature gradient in the furnace.

IV. Crucible and Support/Elevator Therefor

Referring now to FIGS. 11-14, the crucible 21 can be seen to have a relatively wide width dimension and relatively narrow thickness dimension in horizontal plan or cross-sectional view. As above mentioned, the crucible is suitable for melt growth of a single crystal having plate or slab geometry. In this regard, the crucible is narrow in the direction of desired plate thickness and broad in the transverse or width direction.

As is preferred for growing single crystals of calcium fluoride the crucible 21 is a unitary body of graphite and comprises parallel side walls 185, parallel end walls 186 and a bottom wall 187. The side and end walls 185 and 186 are of uniform thickness and relatively thin in relation to the narrow dimension of the crucible, as is preferred. Preferably the side walls 185 are provided at their inner surfaces with a draft angle to facilitate removal of a grown crystal from the crucible. The crucible preferably is made of graphite for use in growing calcium fluoride or other materials that do not wet graphite. For those materials that do wet graphite, the crucible may made of a material that is not wetted by the melt or a graphite crucible may be provided with a liner of such a material, as is desired.

The side and end walls 185 and 186 are thin to maintain maximal temperature gradients as determined in the first instance by the heat source; if the walls were thick, conduction in the walls would unduly lessen the gradient. The limiting "thin-ness" is that imparting mechanical ruggedness needed to survive loading the crucible in and out of the furnace, containment of the melt, etc. Wall thickness thus will depend in part on the crystal size. For example, a 2 inch×7 inch crucible had 3/16 inch walls and the walls probably could have been thinner. For a meter-size crystal, ⅜ inch may still be sufficient—or perhaps thinner with horizontal ribs or other reinforcement to impart strength. An important concept is to limit as much as possible conduction lengthwise along the crucible wall and yield control to the heat source. The wall thickness then should normally always be less than about 1 inch and preferably less than about ½ inch and still more preferably less than about ⅜ inch and even thinner.

The crucible 21 has an open top which is closed by a removable cover plate or lid 188. The removable lid has center hole 189 for permitting passage of the probe rod 38 (FIG. 1) into the interior of the crucible for detecting the height of crystal grown in the crucible during operation of the furnace.

The bottom wall 187 of the crucible is of increasing thickness toward the axis of the crucible so that the thermal conductance in the bottom can be constant or increasing in that direction, thereby to remove heat effectively at the bottom end of the crucible. The bottom wall includes a centrally located seed pocket 192 for accommodating an oriented seed crystal, as is desired for growing calcium fluoride. Even if no seed crystal is to be used, the seed pocket may still be provided to confine the first solidified material to a small zone to facilitate achieving a single crystal start. The top surface of the bottom wall preferably is sloped upwardly from the seed pocket to the end walls for promoting desired crystal growth.

In the illustrated embodiment, the seed pocket 192 is formed in part by the bottom wall 187 and in part by a seed holder 194. The seed holder 194 has going from top to bottom an upper portion 195, peripheral mounting flange 196 and a lower end portion 197. The upper portion 195 is inserted with a close fit in a recess formed in a collar 198 depending from bottom wall 187, and suitable fasteners (not shown) are employed to secure the seed holder at the mounting flange 196 to the bottom wall 187 of the crucible in the manner illustrated in FIGS. 11 and 12.

The lower end portion 197 of the seed holder 194 has an external taper for fitting into a correspondingly tapered hole 200 in the upper end of a cone holder 201. In this manner the crucible is supported by the cone holder 201. As needed, additional means may be provided to prevent relative rotation of the crucible and cone holder about their aligned vertical center axes.

The cone holder 201 is in turn supported by an adaptor 204 which mounts on an elevator shaft 205 (FIGS. 2 and 3). The adaptor 204 has an upwardly opening tapered socket 206 for receiving a correspondingly tapered lower end portion 207 of the cone holder. The adapter 204 also has a downwardly opening tapered socket 208 for receiving the tapered end of the elevator shaft 205. The cone holder preferably is made of graphite whereas the adaptor and elevator shaft preferably are made of Iconel.

With reference to FIGS. 2 and 3, the elevator shaft 205 is axially moveable by well known elevator means indicated diagramatically by box 210. The elevator means 210 is operable in a controlled manner to move the crucible supported thereon vertically within the upper and lower heat zones during growth of a crystal in the hereinafter described manner.

V. Operation

Operation of the crystal growing furnace 20 will now be described in respect to two different modes of operation. One operational mode is a Bridgman-Stockbarger type method where in the crucible is lowered in the furnace during the crystal growing process. The other operational mode is a vertical gradient freeze type method wherein the crucible remains stationery.

A. Elevator Travel Method

When a seed crystal is used, it is loaded and oriented in the seed pocket 192 (FIG. 11) of the crucible 21 to provide a desire crystallographic orientation of the crystal plate or slab to be grown. A charge of crystal growth stock then is loaded into the crucible. Cover plate 188 is placed on and secured by some readily removable means (not shown) to the crucible, and the crucible, heater assembly 24, insulation envelope 24 and vacuum chamber 25 are assembled in the above described manner. The relative dimensions between the upper heater and the crucible are such that the side and end heating panels of the upper heater will be located closely adjacent the sides of the crucible. Preferably the heating panels (or other heating members that may alternatively be employed as hereinafter discussed) are located as close as possible to the side and end walls of the crucible for efficient and desired control over the temperature of the melt. The limiting "closeness" in the illustrated embodiment is that precluding contact between the resistance heating elements and the crucible as this would cause a short. Generally, the spacing between the heating elements and crucible walls, which preferably is uniform across each wall of the crucible, should normally be less than about 1 inch or 2 inches and preferably less than about ½ inch and most preferably less than about ¼ inch. The spacing of the lower heater is also kept small but may be greater as is necessary, for example, in the illustrated embodiment in view of the overlap of the upper and lower heaters.

After assembly, the vacuum chamber 25 is evacuated to a pressure equal to or less than about 1.0 mTorr of Hg. After evacuation, power is applied to the heaters 45, 46 and 47 to heat the crucible 21 initially located in the zone 49 of the upper heater 46 as illustrated in phantom lines in FIG. 1. Power applied to the lower heater 45, upper heater 46 and top heater 47 is increased gradually to slowly increase the temperature of the crystal growth stock. The rate of temperature increase should be slow enough to allow for proper outgassing of materials.

Power to the upper heater 46, and consequently the top heater 47, is increased until the temperature in the melt zone 49 of the upper heater is above the melting point of the crystal material, such as for example by about 50° Centigrade. As for the lower heater 45, power is increased until the temperature in the lower or cooling zone 48 is about 50° Centigrade below the melting point of the crystal material. The temperature differential between the upper and lower heater zones provides a vertical temperature gradient for directional solidification of the crystal. It is noted that the thermal gradient influencing growth quality is established first in the crucible wall and then transmitted to the melt by conduction as well as by absorption of radiation by the melt. Because of the influence of the crucible on the thermal gradient developed in the melt it is preferred that the walls of the crucible are relatively uniform in thickness and relatively thin.

After the charge of crystal growth stock and a desired portion of the seed crystal have melted and a thermal equilibrium condition is achieved, the elevator control means or device 210 is operated to lower the elevator rod 205 and hence the crucible 21. It perhaps should here be noted that when a seed crystal is used it is important that it not be completely melted back as this would render its use ineffective. Therefore, a portion of the seed crystal must be kept from melting, and to this end the support/elevator assembly 23 functions as a heat sink for maintaining the lower portion of the seed crystal below its melting point.

The crucible 21 preferably is lowered at a slow rate such as approximately 1-10 mm/hour. As the crucible is lowered into the cooling zone 48 of the lower heater 45, solidification of the melt will commence at the seed crystal. As the crucible continues to be lowered from the upper melt zone into the relatively cooler cooling zone, crystal growth will progress vertically upwardly through the crucible, while the free (top) surface of the melt correspondingly lowers due to the higher density of solid relative to liquid material in the case of calcium fluoride. Elevator travel is continued until all of the molten material is solidified as a part of the single crystal. In FIG. 20A, lowering of the crucible 21 in relation to the upper and lower heaters 46 and 45 is schematically illustrated along with a plot of melt/crystal temperature along the vertical axis of the crucible at a point during the growth process. The heat sink obtained by the elevator/support structure 23 (and to some extent by the lower open end of the lower heater) is also illustrated.

After the entire charge has been solidified, power to the heaters 45, 46 and 47 is adjusted to provide a uniform temperature in the entire crystal solid. Then power to the heaters is decreased to lower the temperature in the crystal at a slow rate while maintaining a uniform temperature throughout the crystal. The rate of cooling preferably is sufficiently low and the temperature distribution sufficiently uniform to prevent stress and strain from being induced into the grown crystal. After achieving approximately room temperature in the grown crystal, the vacuum chamber 25 is restored to atmospheric pressure and the vacuum chamber, insulation envelope 24, heater assembly 22 and crucible 21 are disassembled as necessary, and the grown crystal is removed from the crucible.

During the growth process thermocouples located in the furnace may be used to determine the temperature at one or more locations in the furnace to facilitate maintenance of control over the growth process as well as to assist the skilled artisan or operator in the empirical development of an acceptable growth program for the given furnace construction and crystal material to be grown.

B. Stationary Crucible Method

In this operational mode the seed crystal and charge of crystal growth stock are loaded into the crucible 21 as above described. In the same manner the crucible, heater assembly 22, insulation envelope 24 and vacuum chamber 25 are assembled, but the crucible with its charge is positioned such that an upper part of the crucible is located in the zone 49 of the upper heater 46 and a lower part of the crucible is located in the zone 48 of the lower heater 45.

After the vacuum chamber 25 has been evacuated, power is applied to the lower, upper and top heaters 45, 46 and 47 to slowly increase the temperature of the crystal growth stock. Again, the rate of increase should be low enough to allow for proper outgassing of materials.

Power is increased in the heaters until the temperature in the crucible is above the melting point of the charge, with the temperature in the upper zone 49 being slightly higher than that in the lower zone 48. After the entire charge and a desired portion of the seed crystal melts, power to upper and lower heaters is decreased either simultaneously or alternately to provide a unidirectional solidification from the seed crystal upward. The power and temperature decrease preferably is controlled to provide a solidification rate of 1-10 mm/hours to create an optically clear solid crystal of calcium fluoride. This power and temperature decrease is continued until all of the molten material is solidified. During growth the height of the crystal solid can be detected by lowering the probe rod 38 (FIG. 1) into the crucible and into contact with the crystal and then observing the vertical height of the upper end of the probe rod through the sight glass preferably with the aid of a vertical scale.

After the entire charge has been solidified, the power to the heaters is adjusted to provide a uniform temperature in the entire crystal solid and then the power to the heaters is decreased to lower the temperature in the crystal at a slow rate while maintaining a uniform temperature throughout the crystal. Again the rate of cooling is preferably low enough and the temperature distribution uniform enough to prevent stress and strain from being induced into the grown crystal. After achieving approximately room temperature in the grown crystal the vacuum chamber is restored to atmospheric pressure and the vacuum chamber, insulation envelope, heater assembly and crucible are disassembled as necessary. The grown crystal may then be removed from the crucible.

VI. Adaptations

The furnace construction and operational modes have been described by way of example and further to relate the best mode of practicing the subject invention as presently developed by the applicant. It should be understood, however, that modification may be made while still achieving the objectives and advantages of the subject invention, and a number of possible modifications/adaptations are hereinafter discussed.

It initially is noted that fundamentally a crucible suitable for melt growth of a single crystal having plate or slab geometry according to the invention is relatively narrow in the direction of the desired plate thickness and relatively broad in the transverse or width direction of the plate/slab geometry. For most applications it is contemplated that the grown crystal will have a flat geometry with parallel side and end surfaces, but it also is contemplated that the subject invention may be applied to grow a single crystal having a curved plate or slab geometry, as might be desired for special applications. However, it is fundamental to the invention that the crystal have a thickness dimension that is small enough to permit adequate control over the growth interface whereas the width dimension may be two, three or many times the thickness dimension of the grown crystal. An objective of the invention is the growth of large crystals including crystals up to and even exceeding 1 meter square.

In accordance with the invention, large single crystals are grown while one dimension of the melt is maintained relatively small to minimize dependence on melt properties in establishing a thermal gradient desired for growth. The elements determining the thermal gradient at the growth interface are essentially fixed in intimate relationship with the growth interface regardless of the extent of crystal already grown or yet to be grown. This provides the distinct advantage that the process and apparatus according to the invention is scalable. That is, a width dimension of the melt may be increased while the thickness is maintained relatively small to maintain control of the growth interface across its width. Accordingly, the problem of maintaining proper control of the growth interface is rendered essentially independent of the wide as well as vertical length dimension of the crystal.

As previously noted, prior commercial processes for growing single component crystals, such as calcium fluoride crystals encountered practical limits of about four inches and possibly up to six inches in diameter. Above this practical limit unacceptable yields would be encountered. This is basically because such prior commercial growth processes offered no way to sustain an adequate, i.e., sufficiently high, thermal gradient over the full extent of the growth interface and throughout the full growth cycle when large crystals must be produced. After a certain point, melt properties such as thermal conductivity become relatively more dominant and preclude maintenance of an adequate or sufficiently high thermal gradient over the full extent of the growth interface. Fluid convection is another limiting factor that reduces gradients in the melt. Presently this limit appears to be about four inches and possibly up to about six inches in the case of a single component crystal. Of course, the limiting dimension will vary with the material of the crystal to be grown.

The subject invention circumvents the above noted limitation of current processes by maintaining one dimension of the melt within the range permitting maintenance of adequate thermal gradient for desired crystal growth so as to free the other dimension from the constraints dictated by dependence on melt properties. The narrow dimension also impedes convection by the confinement that comes with nearby walls.

Accordingly, for $CaF_2$ and similar materials, the thickness dimension of the melt, i.e., the distance between the inner surfaces of the crucible side walls, normally should be less than about 6 inches and preferably less than about 4 inches, whereas the width of the melt, i.e., the distance between the inner surfaces of the crucible end walls, may be two, three or many times greater than the thickness dimension. The ratio of the width dimension to the thickness dimension preferably is greater than about 3:1 and greater than about 4:1 for large width crystals such as those having widths greater than about 20 inches. By way of example, 7 inch×2 inch single crystals of $CaF_2$ have been successfully grown to a height of about 5 inches and other exemplary scaled up sizes of single crystals are 14 inch×4 inch, 20 inch×5 inch and 40 inch×6 inch, the latter preferably being grown in a crucible permitting growth to the height of about 40 inches.

With specific regard to the crucible, principles of the invention may be applied with or without the use of a seed crystal. As above indicated, the crucible may be provided with a seed pocket at the bottom thereof to accommodate an oriented seed crystal onto which the first solidification of molten charge will occur. If no seed is included, the pocket still may be provided to confine the first solidified material to a small zone to facilitate achieving a single crystal start.

Typically the crystal to be grown will have a density greater than that of the melt which in turn will have a density greater than than of the charge of growth stock which may be loaded into the crucible in the form of powder and/or chips. Accordingly, the vertical height of the grown crystal necessarily will be less than the height of the melt when in its fully molten state which in turn will be less than height of the crucible which of course is the upper limit of the height of the charge that can be located into the crucible.

Figure 15:
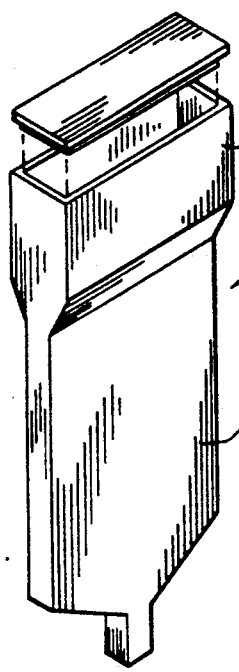
FIG. 15 is an isometric view of a modified form of crucible useful in the practice of the invention.
Figure 16:
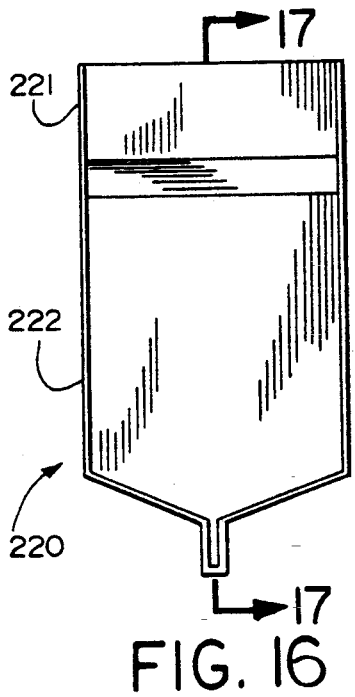
FIG. 16 is a vertical section through the modified crucible of FIG. 15.
Figure 17:
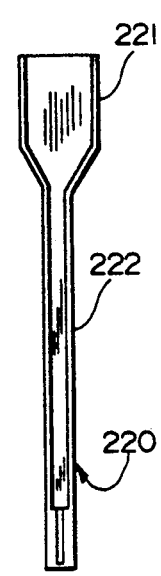
FIG. 17 is a vertical sectional view of the modified crucible taken substantially along the line 17—17 of FIG. 16.

In order to maximize the size or the charge, the crucible may be provided at its upper end with a hopper. A crucible of this type is illustrated in FIGS. 15-17. The hopper 221 has a larger cross-sectional dimension than the lower crystal growing region 232 of the crucible. The hopper allows the crucible to accommodate a large volume of the growth stock which when melted may fill the crucible to about the bottom of the hopper. If desired, the melt may initially extend part way into the hopper since the top surface of the melt will lower during growth of the crystal.

Figure 18:
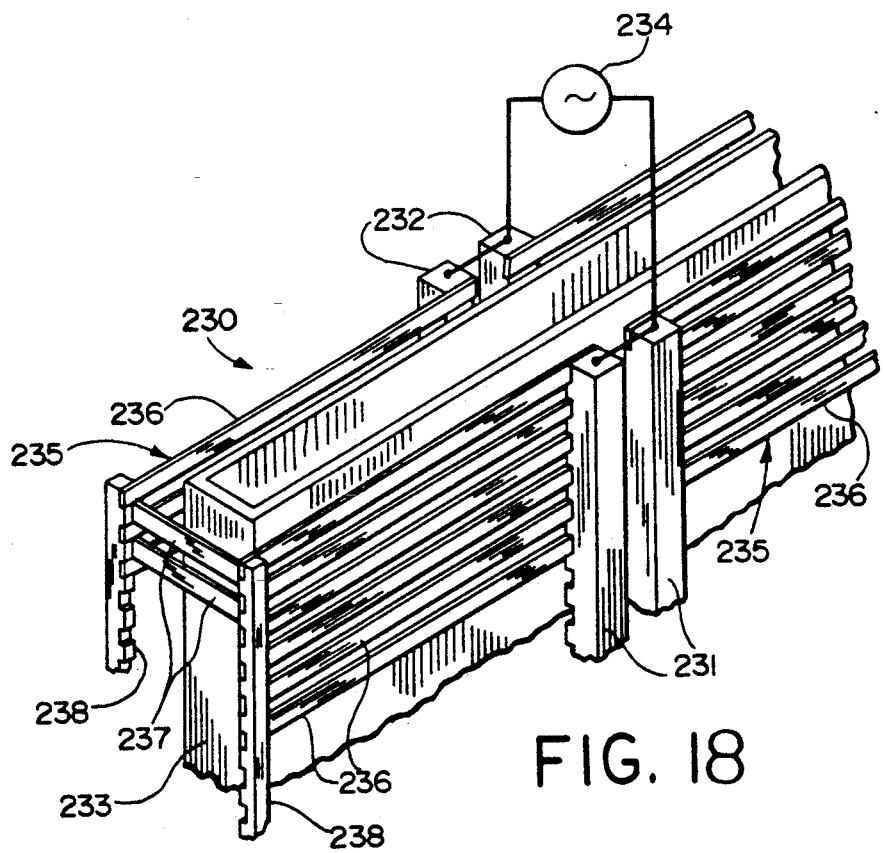
FIG. 18 is a schematic illustration of a modified heater according to the invention.

Referring now to FIG. 18, a modified form of heater compatible with the objectives of the invention is indicated at 230. The heater 230 includes two pairs of vertical posts 231 and 232 respectively centered on and in close proximity to the broad or wide side of the crucible 233. The posts 231 on one side of the crucible are electrically connected together and to a respective terminal of a power source 234. The two posts 232 on the other side of the crucible are connected to the other terminal of the power source. An electrical circuit running between the posts is completed by a parallel array of graphite heater elements 235. The heater elements 235 extend substantially horizontally from one pair of posts 231 around the ends of the crucible to the other pair of posts 232. Each heater element 235 may include side strips 236 and an end strip 237 which serially extend between an associated pair of posts 231 and 232 as shown. At the corners there may be provided support posts 238 for supporting the ends of adjacent side and end strips at the corners.

In FIG. 19 there is schematically illustrated another way in which solidification can be effected controllably. As shown, there may be provided a pair of linear cooling elements 240 near each broad side 241 of crucible 242 and interposed between the crucible and the heater (not shown). The cooling elements 240 are narrow in vertical height and may be moved vertically upward relative to the heater and crucible, starting from the top of the seed crystal or, in the absence of a seed crystal, from the bottom of the seed pocket 243. Alternatively, the crucible may be moved vertically downwardly with the positions of the cooling elements and heater being fixed with respect to one another as further depicted schematically in FIG. 20B. As seen in FIG. 20B, the cooling elements are located between the upper and lower heaters (heat zones).

The cooling elements 240 function to effect solidification of the melt by acting on the melt zone nearest them. That is, they enter into establishing the thermal gradient in the nearby melt zone and remain in more or less fixed geometric relationship, i.e., proximity, to the melt-solid interface throughout the growth run, regardless of melt depth or height of crystal grown. The cooling elements may be an array of gas jets distributed across the broad sides 241 of the crucible. For use with growth in a vacuum, the cooling elements may be tubes through which fluids are passed, the tubes having, for example, an outside diameter of about ½ inch and being spaced in close proximity to the crucible side walls preferably less than about ¼ inch. In either case the cooling elements may be shaped to effect a desired convexity or other shape of the growth interface such as will optimize the quality of the resulting crystal.

As illustrated in FIG. 20B, the cooling elements 240 provide for a localized increase in the temperature gradient at the growth interface across the wide dimension of the crucible. The temperature gradient at the growth interface is depicted by the line 244, and this may be compared by way of example to the lower although still acceptable temperature gradient depicted by the line 245 in FIG. 20A.

Provision also may be made for establishing a horizontal temperature gradient as well as a vertical temperature gradient, as would be particularly advantageous if convexity of the growth interface is desired. The above described operation of the preferred heater construction does provide a convex growth interface, but this otherwise may be achieved. For example, with reference to the heater construction illustrated in FIG. 18, the configuration of the heating elements 235 may be varied as by tapering them to smaller cross-section toward and around the ends of the crucible, by strategic placement of the heater elements relative to one another and the crucible, by utilizing a crucible with a wall thickness that varies top-to-bottom and center-to-edge, or by combinations of these features. Each tier of heater strips can be individually configured to achieve a desired gradient along the length of the crucible and each heater strip can be configured along its length to refine temperature control transversely in the crucible to achieve desired gradients in the melt. In addition or alternatively, the heater strips or other heating elements at each tier or vertical elevation may be individually powered to provide multiple individually controlled heater elements and a corresponding number of independent temperature zones along the vertical axis of the crucible.

An exemplary apparatus is schematically illustrated in FIG. 20C at 250. The apparatus 250 includes crucible 251, stationary crucible support/heat sink 252, and resistance heater 253 closely surrounding the crucible. The resistance heater 253 has multiple power taps $V_1, V_2, \ldots V_k$ for providing respective multiple independent temperature zones along the vertical height of the crucible.

As a further adaptation, there could be just one power input with the shape of the gradient defined by the different resistances of individual heater sections. This is schematically illustrated in FIG. 20D wherein the different resistances are designated $v_1, v_2, \ldots v_k$ and the single power input is indicated at V.

As will be appreciated, one or more of these features may also be applied to the above described preferred construction of a furnace according to the invention. For example, and looking at FIG. 9, the side wall segments 80 and 81 may decrease in vertical height going from the middle to the side edges of the side walls 54 for contributing to a horizontal temperature gradient in a precisely controlled manner because of the close proximity of the heater panel segments to the growth interface.

Although the present invention has been described with respect to a preferred embodiment, it is to be understood that the invention is not limited to the details thereof. A number of possible modifications and substitutions have been suggested in the course of the foregoing detailed description. Also equivalent alterations and modifications will occur to others skilled in the art upon the reading and understanding of this specification. The present invention includes all such equivalent alterations and modifications, and is limited only by the scope of the following claims.

What is claimed is:

1. A method for growing a large single crystal in plate/slab form from a melt comprising the steps of:
   melting crystal growth stock in a crucible having a wide dimension and a narrow dimension, the narrow dimension being less than about six inches to permit adequate control of the growth process at the melt-crystal interface, and the wide dimension being greater than six inches, and
   controlling heat input into the melt to establish a vertical temperature gradient in the melt for crystal growth progressively vertically upward through the crucible, the step of controlling heat input including using side resistance heaters in close proximity to and directly adjacent to the wide dimension sides of the crucible to input heat into the melt.

2. A method as set forth in claim 1, including the step of using linear cooling elements in close proximity to the sides of the crucible to increase the temperature gradient locally at the melt-crystal interface across the wide dimension at the crucible.

3. A method as set forth in claim 1, wherein the step of controlling heat input further includes using end resistance heaters in close proximity to and directly adjacent to the narrow dimension sides of the crucible to input heat into the melt.

4. A method as set forth in claim 3, wherein the side and end resistance heaters are planar and parallel to respective sides of the crucible.

5. A method as set forth in claim 3, including the step of surrounding the side and end resistance heaters with an insulating envelope.

6. A method as set forth in claim 1, wherein the wide dimension is at least twice the narrow dimension.

7. A method as set forth in claim 1, wherein the wide dimension is at least three times the narrow dimension.

8. A method as set forth in claim 1, wherein the wide dimension is at least four times the narrow dimension.

9. A method as set forth in claim 1, wherein the narrow dimension is less than about four inches.

10. A method as set forth in claim 9, wherein the wide dimension is at least twice the narrow dimension.

11. A method as set forth in claim 9, wherein the wide dimension is at least three times the narrow dimension.

12. A method as set forth in claim 9, wherein the wide dimension is at least four times the narrow dimension.

13. A method as set forth in claim 1, wherein the step of controlling heat input includes vertically lowering the crucible from an upper heat zone to a lower heat zone.

14. A method as set forth in claim 1, wherein the step of controlling includes holding the crucible stationary with an upper portion of the crucible located in an upper heat zone and a lower portion of the crucible located in a lower heat zone, and controlling at the upper and lower heat zones the heat input to the melt in the crucible for establishing a vertical temperature gradient in the melt to induce crystalline growth from the bottom of the crucible to the top of the crucible.

15. A method as set forth in claim 1, including the step of locating a top heater at the upper end of the side resistance heaters.

16. A method as set forth in claim 1, including the step of locating the resistance heaters and crucible in an environment chamber.

* * * * *